(12) United States Patent
Mochizuki

(10) Patent No.: US 6,459,132 B1
(45) Date of Patent: *Oct. 1, 2002

(54) IMAGE SENSING DEVICE AND PRODUCTION PROCESS THEREOF

(75) Inventor: Chiori Mochizuki, Sagamihara (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,577

(22) Filed: Oct. 7, 1998

(30) Foreign Application Priority Data

Oct. 9, 1997 (JP) .............................. 9-277473

(51) Int. Cl.[7] .............................. H01L 31/00
(52) U.S. Cl. .................. 257/443; 257/448; 257/758
(58) Field of Search ................. 257/443, 448, 257/459, 758, 458

(56) References Cited

U.S. PATENT DOCUMENTS 4,413,272 A  * 11/1983  Mochizuki et al. ......... 257/529
6,069,393 A  * 5/2000  Hatanaka et al. ........... 257/443
6,127,714 A  * 10/2000  Mochizuki ................... 257/443

OTHER PUBLICATIONS

M.J. Powell, "Amorphous Silicon Image Sensor Arrays", Mat. Res. Soc. Symp. Proc., vol. 258 (1992), pp. 1127–1137.

R.A. Street, "Two–dimensional amorphous silicon image sensor arrays", J. Non–Crystalline Solids, 198–200 (1996), pp. 1151–1154.

* cited by examiner

*Primary Examiner*—Mark V. Prenty
(74) *Attorney, Agent, or Firm*—Fitzpatrrick, Cella, Harper & Scinto

(57) ABSTRACT

A photosensing device having a photoelectric conversion element and a TFT with a high S/N ratio and with stable characteristics can be provided by carrying out patterning of source and drain electrodes of the TFT part and patterning of an upper electrode of the photoelectric conversion element separately and by carrying out removal of an $n^+$-layer between the source and drain electrodes of the TFT part in a separate step.

3 Claims, 12 Drawing Sheets

IMAGE SENSING DEVICE AND PRODUCTION PROCESS THEREOF

BACKGROUND OF THE INVENTION

1. Field of the Invention

The present invention generally relates to an image sensing device typified by a photosensing device (photodetecting device) in one-dimensional and two-dimensional image reading devices utilized in facsimile machines, digital copying machines, scanners, and so on, and to a production process thereof and, more particularly, the invention relates to an image sensing device well suited for the application for wavelength-converting a radiation such as X-ray or γ-ray to a photosensitive wavelength region such as visible light by a fluorescent screen and reading the converted light, and to a production process thereof.

2. Related Background Art

Heretofore, as a reading system used for input of an image information in the facsimile machines, digital copying machines, radiation sensing apparatuses or the like, there has been used an optical system using an image reducing optical system and a CCD sensor. However, in recent years, the development of photoelectric converting semiconductor material typified by amorphous silicon (hereinafter abbreviated as a-Si film) has forwarded the development of a contact type sensor in which a photoelectric conversion element is formed on a large-area substrate and in which an image information is read with an optical system having 1:1 magnification to an information source, which contact type sensor is being put to practical use.

Since the a-Si film can be used not only as photoelectric converting material but also as semiconductor material for a switching TFT, it possesses an advantage that semiconductor layers of the photoelectric conversion element and semiconductor layers of the switching TFT can simultaneously be formed.

As a typical example of a photosensor using this a-Si film, there is included a pin type photosensor such as illustrated in a schematic sectional view of FIG. 1. Reference numeral 101 designates a glass substrate, 102 a lower electrode, 103 a p-type semiconductor layer (hereinafter abbreviated as a p-layer), 104 an intrinsic semiconductor layer (hereinafter abbreviated as an i-layer), 105 an n-type semiconductor layer (hereinafter abbreviated as an n-layer), 106 a transparent electrode, and 107 incident light. The photosensor of FIG. 1 has the structure in which the layers are stacked in the above-mentioned order on the glass substrate 101.

This photosensor can be operated by use of a circuit configuration such as illustrated in FIG. 2, in which reference numeral 110 denotes a pin type sensor, 111 a power source, and 112 a detector such as a current amplifier. In the photosensor 110, the side C represents the side of the transparent electrode 106 while the side A the side of the lower electrode 102. The voltage of the power source 111 is set such that a positive voltage is applied to the side C relative to the side A of the photosensor 110.

The basic operation of this pin type photosensor will be outlined referring to FIG. 1 and FIG. 2. When the light 107 is incident in the direction indicated by the arrow as illustrated in FIG. 1, the incident light undergoes photoelectric conversion in the i-layer 104 to generate electrons and holes. Since the power source 111 applies an electric field to the i-layer 104, the electrons move toward the side C, i.e., through the n-layer 105 into the transparent electrode 106, while the holes move toward the side A, i.e., to the lower electrode 102. This means that a photocurrent flows in the photosensor 110.

Further, when there is no incidence of light 107, neither electrons nor holes are generated in the i-layer 104. For the holes in the transparent electrode 106, the n-layer 105 works as a hole injection inhibiting layer; for the electrons in the lower electrode 102, the p-layer 103 works as an electron injection inhibiting layer. As a consequence, neither electrons nor holes can move, so that no electric current flows. As described, the electric current to flow in the circuit varies depending upon presence or absence of incidence of light. The operation as a photosensor is achieved by detecting the current by the detector 112 of FIG. 2.

However, it is not easy for the above pin type photosensor to realize a photosensing device of a high S/N ratio and a low cost for the following reasons. The first reason is that the pin type photosensor has to include the injection inhibiting layers of the p-layer and n-layer. This is because in the pin type photosensor of FIG. 1 the n-layer 105 as the injection inhibiting layer needs to have characteristics to guide electrons to the transparent electrode 106 and to inhibit holes from entering the i-layer 104. If either one of the characteristics is missed, the photocurrent will decrease or the current without incidence of light (hereinafter referred to as dark current) will appear and increase, which will cause lowering in the S/N ratio. In order to improve the characteristics, it is normally necessary to optimize the film quality of the i-layer 104 and the n-layer 105, i.e., to optimize film-forming conditions, particularly, various conditions including thermal treatment conditions after production of the layers.

On the other hand, the p-layer 103, although having the reverse relation between electrons and holes, also needs to have characteristics to guide holes to the lower electrode 102 and to inhibit electrons from entering the i-layer 104 and, just as in the case of the n-layer 105 described above, it is also necessary to optimize the respective conditions for the i-layer 104 and p-layer 103. In other words, in general, there is a difference in conditions for the optimization of the n-layer and for the optimization of the p-layer and it is difficult to satisfy the conditions of the two optimizations simultaneously. Namely, there is a possibility that the necessity for the injection inhibiting layers of p-layer and n-layer in the same photosensor may be an obstacle to formation of a photosensor with a high S/N ratio.

The second reason will be described referring to FIG. 3. FIG. 3 schematically shows a switching TFT. This TFT is utilized as a part of a control section in formation of a photosensing device. In the figure, reference numeral 101 designates a glass substrate, 102 a lower electrode, 107 an insulating film, 104 an i-layer, 105 an n-layer (or $n^+$-layer), and 160 an upper electrode.

This switching TFT is produced in the following sequence. The lower electrode 102 functioning as a gate electrode G, the gate insulating film 107, the i-layer 104, the n-layer 105, and the upper electrode 160 functioning as source-drain electrodes (hereinafter abbreviated as S-D) are successively formed on the glass substrate 101, the upper electrode 160 is etched to form the source-drain electrodes, and thereafter the n-layer 105 is partly removed to form a channel portion 170.

Since the switching TFT has such a property as to be sensitive to the interface state between the gate insulating film 107 and the i-layer 104, it is normally preferable that the production process described above be carried out in the form of continuous film formation without breaking vacuum.

When the pin type photosensor described above is formed on the same substrate as this switching TFT is, the aforementioned layer structure would cause increase of production cost and lowering in the characteristics. The reason is the difference in the layer structure sequence between them; the photosensor illustrated in FIG. 1 has the structure of the electrode, p-layer, i-layer, n-layer, and electrode in this order from the substrate side, whereas the switching TFT has the structure of the electrode, insulating layer, i-layer, n-layer, and electrode in this order from the substrate side.

This means that the photosensor and the switching TFT cannot be produced simultaneously by the same process. In other words, they are produced by complex processes in which many film-formation and photolithography steps and so on are repeated to form necessary layers in necessary areas, which lowers the yield but increases the cost.

For example, if the i-layer and n-layer are used in common to the pin type photosensor and the switching TFT in order to simplify the production process, it will be possible at least to continuously deposit the gate insulating layer and the p-layer, to remove the p-layer in the switching TFT part, and thereafter to continuously form the i-layer and the n-layer. However, this will result in contaminating the important interface between the gate insulating film and the i-layer of the switching TFT and the interface between the p-layer and the i-layer of the pin type photosensor to cause degradation of the characteristics and lowering in the S/N ratio.

It is also hard to produce a capacitive element (hereinafter referred to as a capacitor), which is necessary for obtaining an integral of charge or current generated by the pin photosensor, with such good characteristics as to demonstrate little leak and in the same structure as that of the photosensor. That is, it is absolutely necessary for the capacitor to have a layer for inhibiting movement of electrons and holes as an intermediate layer between two electrodes, for accumulating charge between the two electrodes. However, since the layer structure of the pin photosensor uses only the semiconductor layers between the electrodes, it is not formed into a good capacitor with little leak.

As described above, under such conditions that matching is not achieved in terms of the process or in terms of the characteristics in producing the switching TFT and the capacitor which are important elements for constituting the photosensing device, the steps inevitably become complicated and the yield is lowered. The points stated above might pose significant issues in some cases, particularly, where the photosensing device having a lot of photosensors arranged one-dimensionally or two-dimensionally and having a function of successively detecting photosignals therefrom is implemented as a high-performance and multi-functional device at a low cost.

SUMMARY OF THE INVENTION

The present invention has been accomplished under the above circumstances and an object of the invention is to provide a photosensing device and a production process thereof that permit formation of the photoelectric conversion element and switching TFT with a high S/N ratio and with stable characteristics by one and the same process.

Another object of the present invention is to implement an inexpensive photosensing device with a high S/N ratio by producing a photoelectric conversion element comprising a first electrode layer, an insulating layer, a photoelectric conversion semiconductor layer, a carrier injection inhibiting layer for inhibiting a carrier from being injected into the semiconductor layer, and a second electrode layer, as an MIS (Metal Insulator Semiconductor) type photoelectric conversion element, and a TFT comprising a first electrode layer, an insulating layer, a semiconductor layer, an ohmic contact layer to the semiconductor layer, and a second electrode layer, as a switching TFT (Thin Film Transistor), on an insulating substrate by the same and simplified production process.

According to one aspect of the present invention, there is provided a process of producing a photosensing device having at least a photoelectric conversion element and a switching TFT, comprising the steps of:

a) forming a first electrode layer by use of a first mask;

b) successively stacking an insulating layer, a semiconductor layer, and an $n^+$-type semiconductor layer on the electrode layer;

c) forming a contact hole for connection of a second electrode layer by use of a second mask;

d) patterning the second electrode layer to serve at least as source-drain electrodes of the switching TFT, by use of a third mask;

e) removing the $n^+$-type semiconductor layer exposed between portions of the second electrode layer;

f) patterning the second electrode layer in an area except for the source-drain electrodes of the switching TFT, by use of a fourth mask; and g) effecting isolation between elements by use of a fifth mask.

According to another aspect of the present invention, there is provided a photosensing device comprising a pixel comprising a photoelectric conversion element and a switching TFT arranged corresponding to the photoelectric conversion element on a substrate, and a wire associated with the pixel, wherein at least a part of the wire is of a layered structure through a contact hole.

According to still another aspect of the present invention, there is provided a process of producing a photosensing device having a photoelectric conversion element and a TFT, comprising carrying out patterning of source-drain electrodes of the TFT part and patterning of an upper electrode of the photoelectric conversion element separately in different steps.

DESCRIPTION OF THE PREFERRED EMBODIMENTS

Embodiment 1

A first embodiment of the present invention will be described in detail with reference to FIGS. 4 to 10. FIGS. 4 to 10 schematically show the cross-sectional structure of a two-dimensional photosensing device in the order of steps of a production process thereof. Further, FIGS. 11 to 14 show examples of mask patterns used in the respective steps. The following description is given using an example of one unit pixel for easy of understanding.

Figure 1:
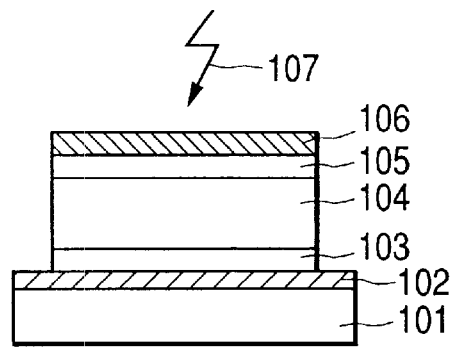
FIG. 1 is a schematic, sectional view explaining an example of the pin type photosensor.
Figure 2:
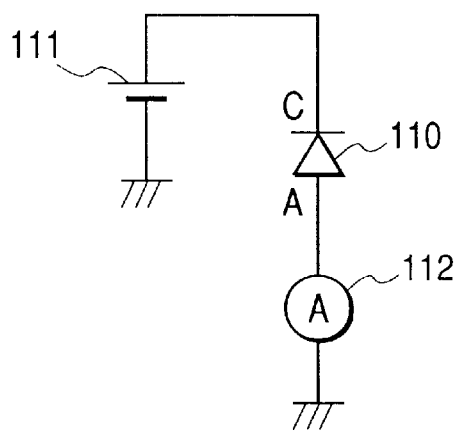
FIG. 2 is a schematic circuit diagram showing an example of a circuit using the pin photosensor.
Figure 3:
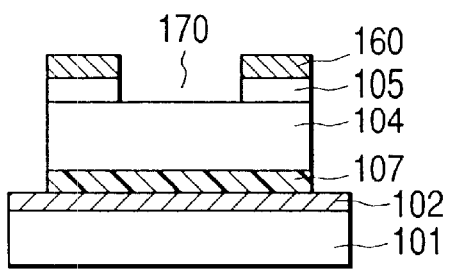
FIG. 3 is a schematic, sectional view showing an example of the structure of a TFT.
Figure 4:
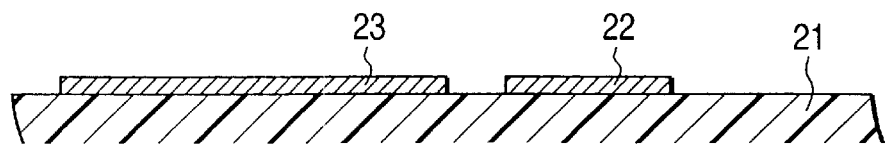
FIGS. 4, 5, 6, 7, 8, 9, 10, 16, 18, 19 and 20 are schematic, sectional views each for explaining an example of a production step of a photosensing device according to the present invention.
Figure 11:
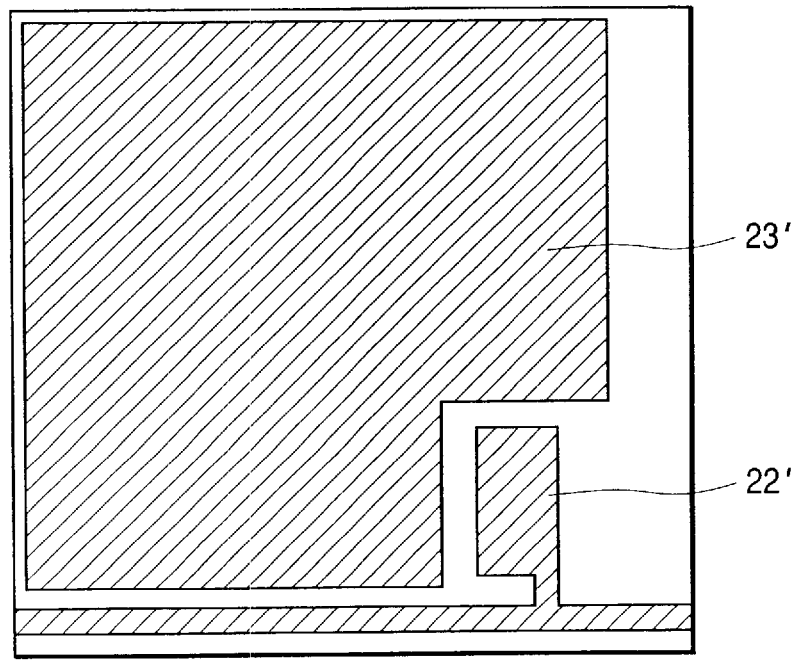
FIGS. 11, 12, 13, 14, 17, 21, 22, 23, 24, 25 and 26 are schematic plan views each for explaining an example of a photomask used in production of a photosensing device according to the present invention.

In the first step, a thin film of Cr is formed in the thickness of 1000 Å on glass substrate 21 (trade name: OA-2, mfd. by Nihon Denki Garasu) by sputtering as illustrated in FIG. 4 and thereafter, using a first mask illustrated in FIG. 11, a gate electrode 22 of a switching TFT and a lower electrode 23 of a photosensor are formed by photolithography. In FIG. 11, hatched areas 22', 23' correspond to mask patterns for formation of the gate electrode 22 and the lower electrode 23, respectively. The area connected to the gate electrode 22 and extending horizontally in the figure corresponds to a gate driving line.

Figure 5:
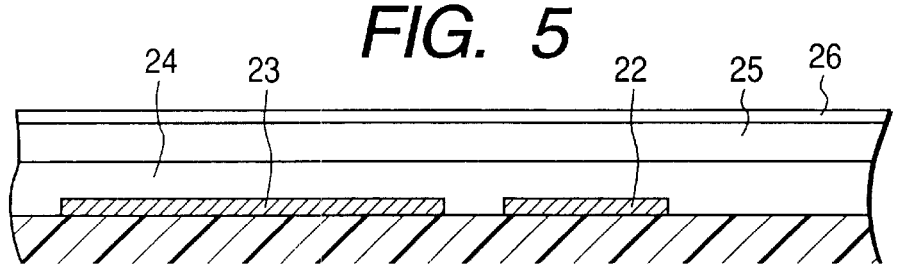

In the second step, as illustrated in FIG. 5, continuous film formation is carried out by plasma CVD to form an SiN film 24 in the thickness of 3000 Å as a gate insulating film of the switching TFT, an a-Si film in the thickness of 5000 Å as a photoelectric conversion layer of the photosensor and as a semiconductor layer of the switching TFT, and an $n^+$-film 26 in the thickness of 1000 Å as a carrier injection inhibiting layer of the photosensor and as an ohmic contact layer of the switching TFT.

Figure 6:
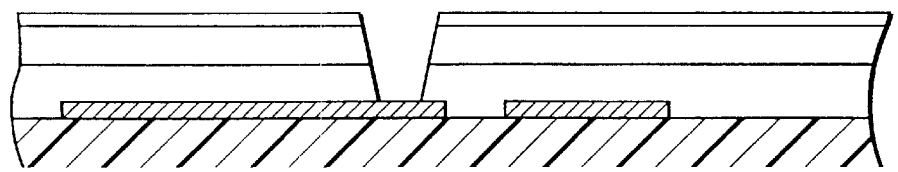
Figure 12:
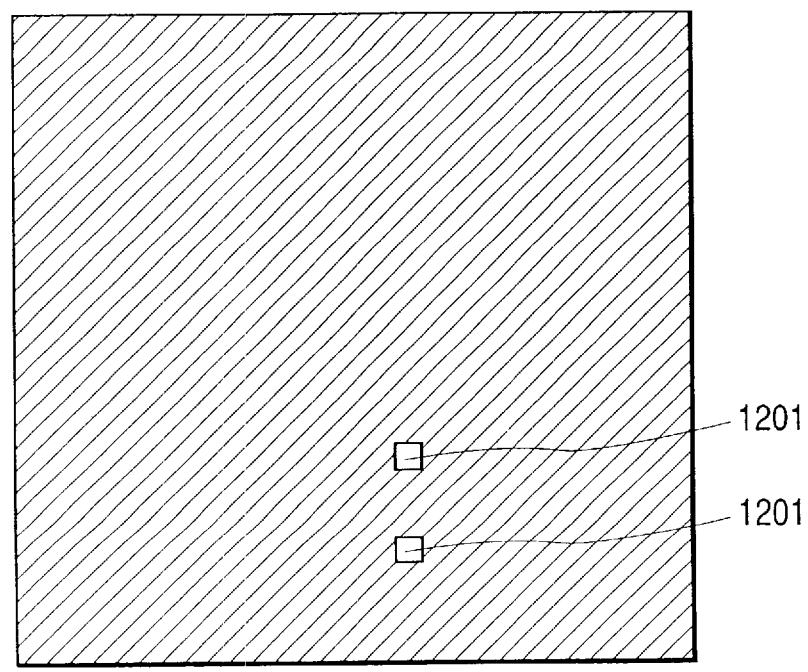
Figure 13:
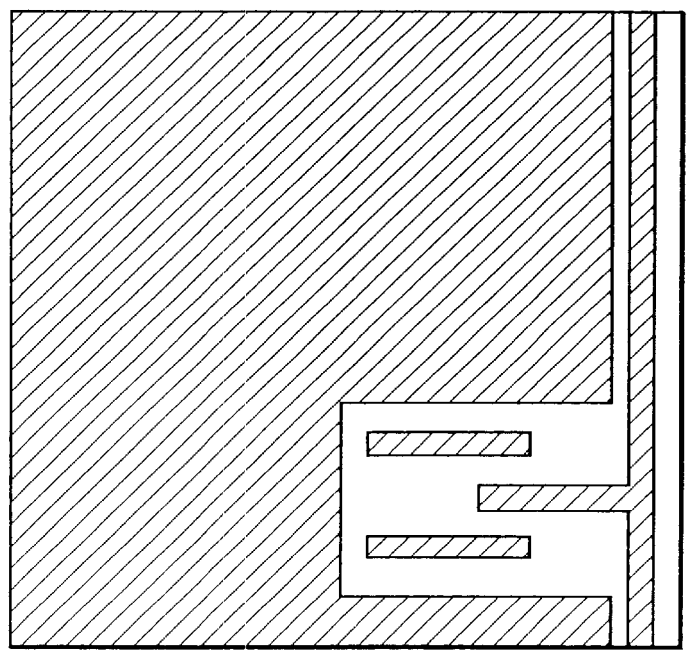

In the third step, as illustrated in FIG. 6, contact holes are formed. Specifically, a predetermined pattern is formed by photolithography with a second mask illustrated in FIG. 12 and the layers are processed by CDE (Chemical Dry Etching). In FIG. 12 areas 1201 correspond to the contact hole parts. The SiN film 24, a-Si layer 25, and $n^+$-film 26 are partly removed in correspondence to the areas 1201, so as to expose the lower electrode 23 therein.

Figure 7:
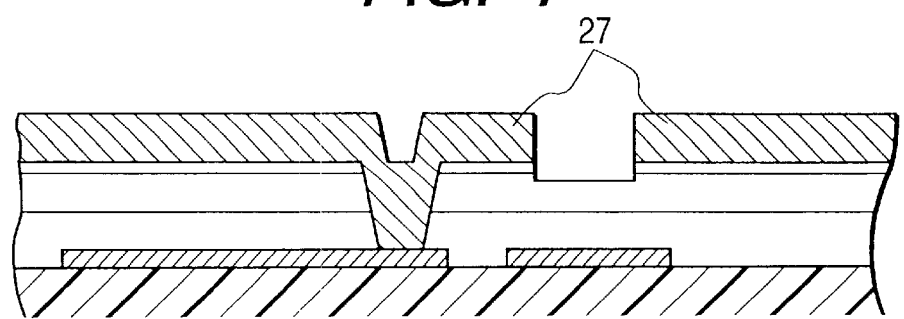

In the fourth step, a thin film of Al is formed in the thickness of 1 μm by sputtering, as illustrated in FIG. 7. Therefore, the lower electrode 23 is electrically connected to the Al thin film 27. After that, a pattern of the Al thin film 27 is formed including portions to become the source-drain electrodes of the switching TFT by photolithography with a third mask illustrated in FIG. 13 (whereby the Al thin film remains in the hatching pattern illustrated in FIG. 13). Subsequently, the RIE (Reactive Ion Etching) process is carried out to etch the $n^+$-film 26 in the thickness of 1000 Å and the a-Si film 25 in the thickness of about 200 Å in the other region than the portions covered by the Al thin film 27. This completely removes the $n^+$-film between the source and drain electrodes.

Figure 8:
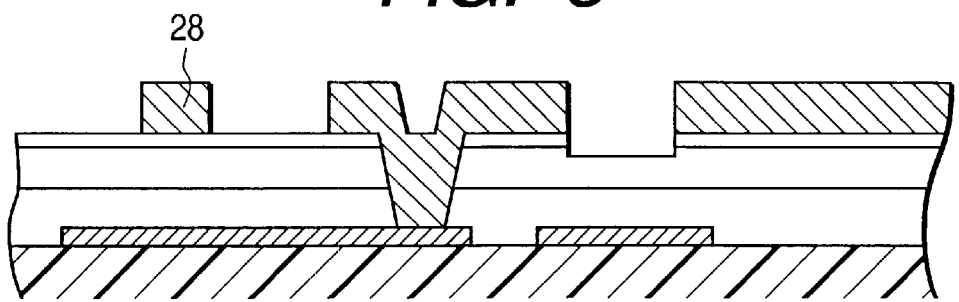
Figure 14:
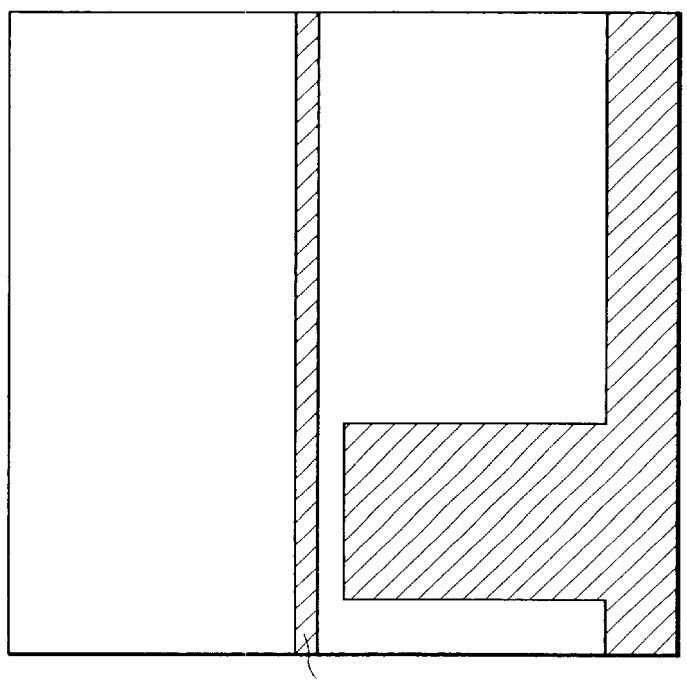

In the fifth step, as illustrated in FIG. 8, an upper electrode 28 of the photosensor is formed by photolithography with a fourth mask illustrated in FIG. 14. At this time, the mask pattern is formed so as to protect the TFT part and output lines connected to the source and drain electrodes of the TFT part. In FIG. 14 numeral 28' represents the area corresponding to the upper electrode 28.

Figure 9:
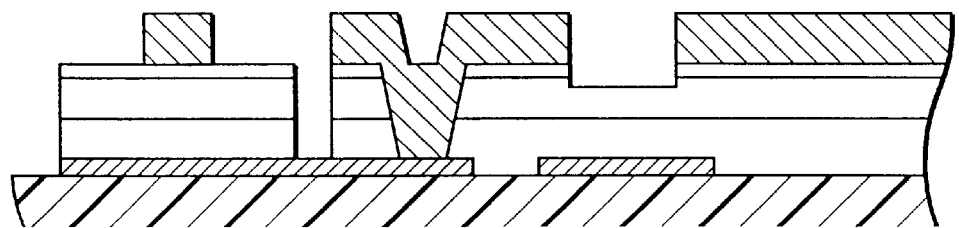

In the sixth step, as illustrated in FIG. 9, a predetermined pattern is formed by photolithography with a fifth mask (not illustrated) and the $n^+$-film, a-Si film, and SiN film are etched away by RIE to isolate the elements from each other (isolation between elements).

Figure 10:
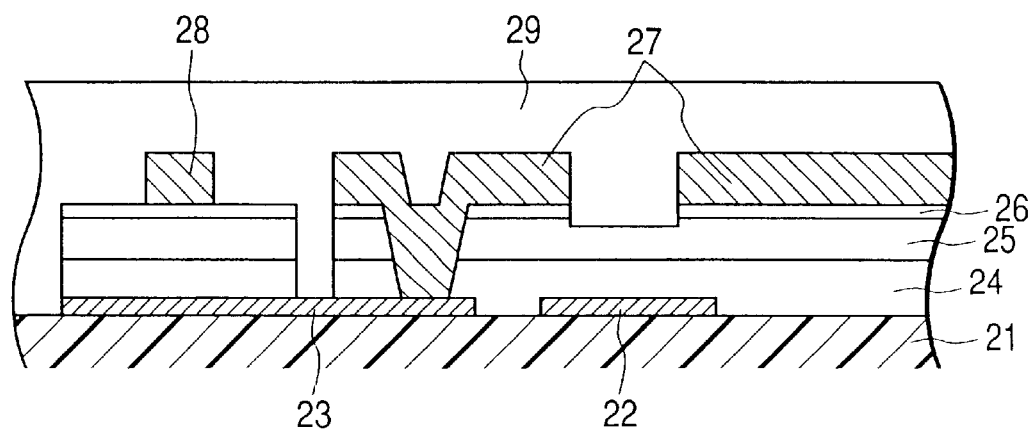

In the seventh step, as illustrated in FIG. 10, an SiN film is formed as a passivation film 29 by plasma CVD, thereafter a predetermined pattern is formed with a sixth mask (not illustrated), and unnecessary portions of the film corresponding to wire leading-out parts (not illustrated) are etched away by RIE.

After that, characteristic inspection is carried out by probing to the wire leading-out parts, and connection of an open portion of the wire by laser CVD (Chemical Vapor Deposition) and cutting of a shorted part and separation of a defective part by laser are carried out as needed. Then, the repaired parts are protected with polyimide.

Figure 15:
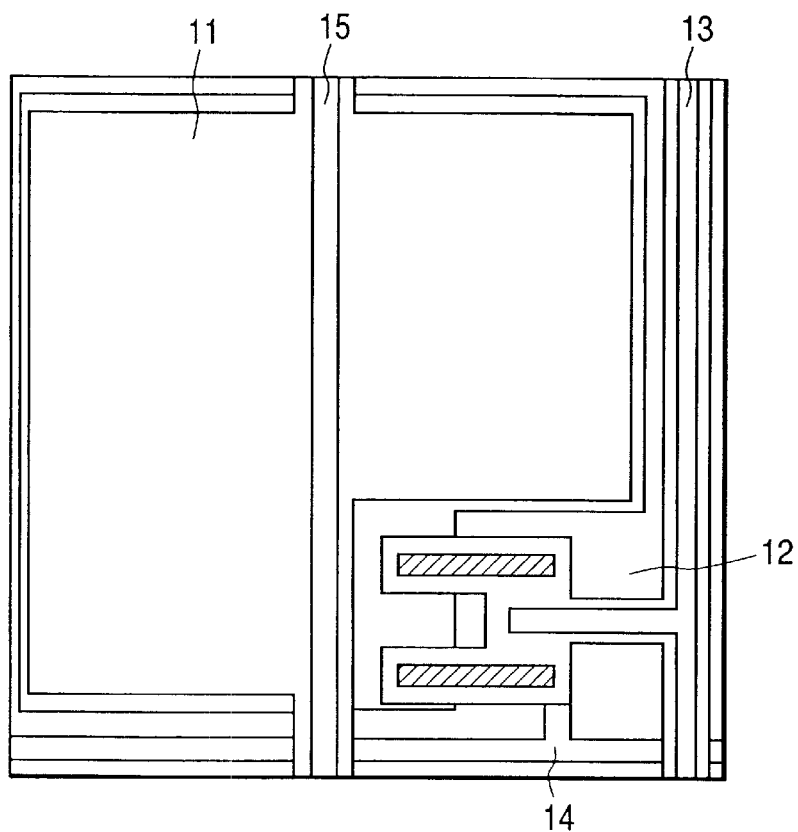
FIGS. 15 and 27 are schematic plan views (corresponding to one pixel) showing an example of a photosensing device according to the present invention, respectively.

The photosensing device produced in this way has a configuration as illustrated in a schematic plane view of FIG. 15. In the figure, reference numeral 11 designates the MIS type sensor part, 12 the switching TFT part, 13 the signal wire, 14 the gate wire, and 15 the upper electrode wire of the sensor.

As described above, forming the photoelectric conversion element part and the TFT part of the same layer-stacking structure makes easy the production for film formation, and selection of use of either a common mask or separate masks according to the necessity makes it possible to produce the device in a high yield while satisfying the required characteristics of the respective elements.

Particularly, as to the removal of the Al thin film, in order that the $n^+$-layer does not remain in the area corresponding to the channel part of the TFT, and that the Al thin film can be utilized as an etching mask, separate masks are used for patterning of the Al thin film in the TFT part and for patterning thereof in the photoelectric conversion element part. This makes it possible to surely remove an unnecessary region of the $n^+$-layer and to leave a necessary region of the $n^+$layer without any damage, which can also achieve substantial simplification of the production steps.

Embodiment 2

A second embodiment will be described below.

The second embodiment of the present invention will be described to show a production process of a photosensing device and an X-ray detecting device (also referred-to as X-ray sensing apparatus) using a fluorescent screen for converting radiation such as X-ray to visible light. The first step to the sixth step of this process are substantially the same as in Embodiment 1. Therefore, the following describes only the production process in and after the seventh step.

Figure 16:
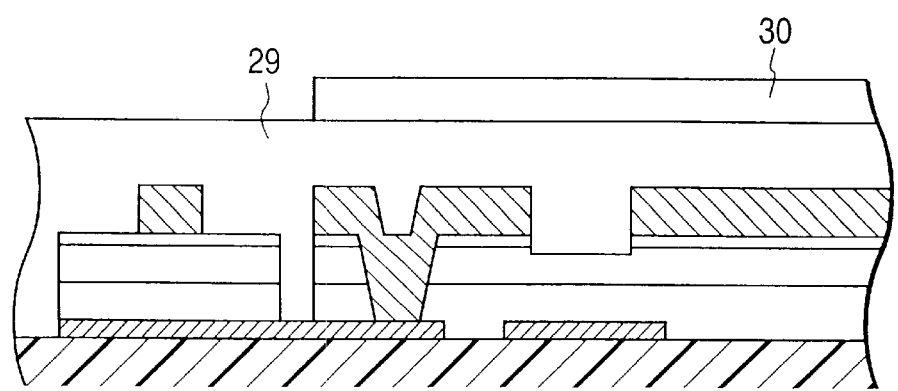
Figure 17:
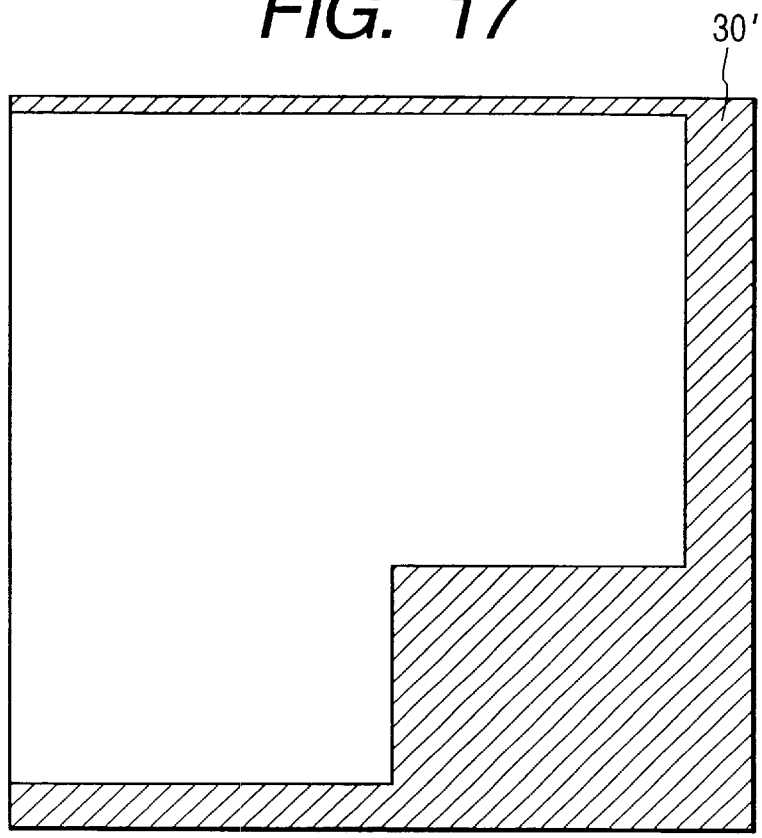

In the seventh step, as illustrated in FIG. 16, after an SiN film 29 has been formed as a passivation film by plasma CVD, a filter 30 of red color is formed as a shielding film in a predetermined pattern including the switching TFT part etc. by use of a sixth mask illustrated in FIG. 17 (wherein numeral 30' corresponds to the filter part). The color of the filter 30 is not limited to red. A filter of any color may be employed as long as it can intercept light of the green family which normally includes luminous colors of the fluorescent screen or the like. Those filters which have transparency but intercept unwanted light are advantageous in that the TFT part can easily be recognized therethrough until the last step.

Figure 18:
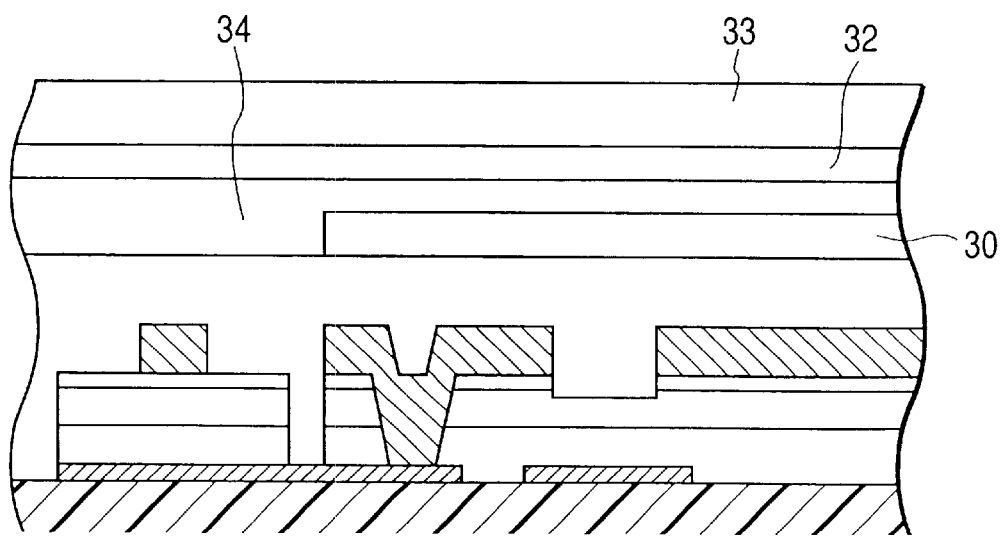

In the eighth step, unnecessary portions including a wire leading-out part (not illustrated) are masked, polyimide resin 34 is applied to form a protective film as illustrated in FIG. 18, and the SiN film 29 is etched by RIE using the polyimide resin as the mask.

In the ninth step, a fluorescent screen 33 is bonded through an adhesive 32 such as of epoxy, as illustrated in FIG. 18.

In the present embodiment the photoelectric conversion element part and the TFT part can be produced in a high yield and with adequate characteristics as described above. Therefore, the large-area photodetector such as the X-ray detecting device can be obtained in a high yield and the X-ray detecting device can be provided at a lower cost, with higher quality, and with higher performance.

Embodiment 3

Figure 19:
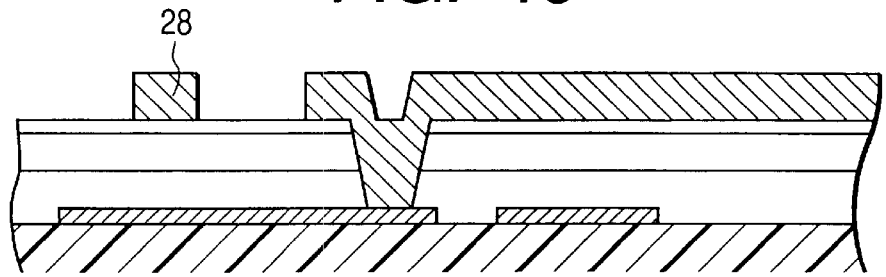

A third embodiment of the present invention is a production process of steps in which the order of the fourth and the fifth steps of Embodiment 1 are reversed. Namely, the present embodiment is an example in which the upper electrode 28 of the photosensor and the source-drain electrodes 27 of the TFT are formed in the reverse order. Specifically, the fourth step is to form the Al thin film in the thickness of 1 μm by sputtering, as illustrated in FIG. 19. After that, the upper electrode 28 of the photosensor is formed by photolithography using the fourth mask (FIG. 14) of Embodiment 1.

Figure 20:
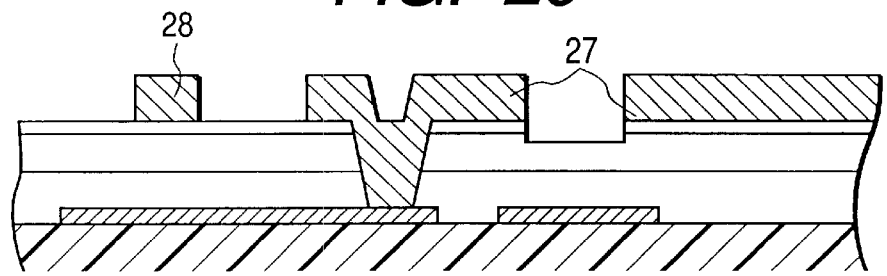

In the fifth step, as illustrated in FIG. 20, the source and drain electrodes 27 of the switching TFT are formed by photolithography using the third mask (FIG. 13) of Embodiment 1. Subsequently, the RIE process is successively carried out to etch the $n^+$-film in the thickness of 1000 Å and the a-Si film in the thickness of about 200 Å.

As described above, the present invention permits the order of steps to be changed as needed.

Embodiment 4

A fourth embodiment of the present invention is an example in which Embodiment 1 is modified by providing the patterns with redundancy in consideration of the yield. Specifically, the following describes the example in which each of the patterning in the first step and the patterning in the sixth step is carried out plural times to decrease opens and shorts in the wires.

Figure 21:
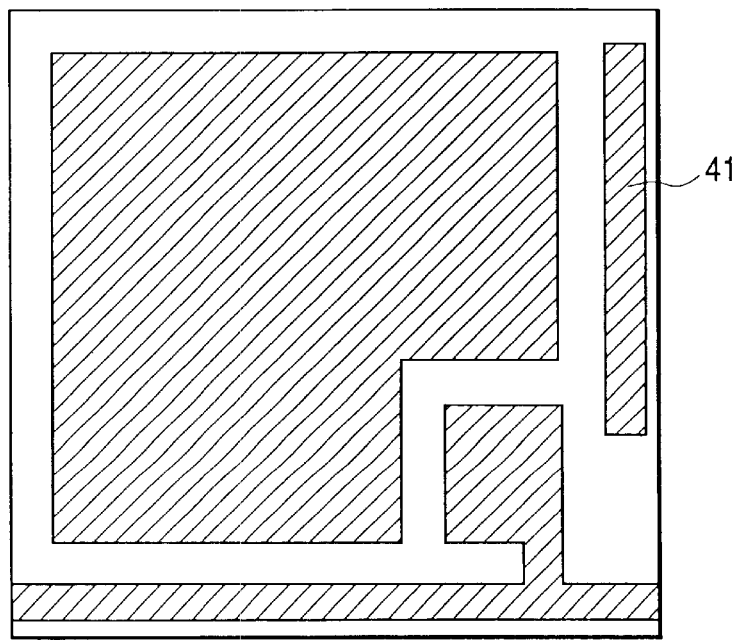
Figure 22:
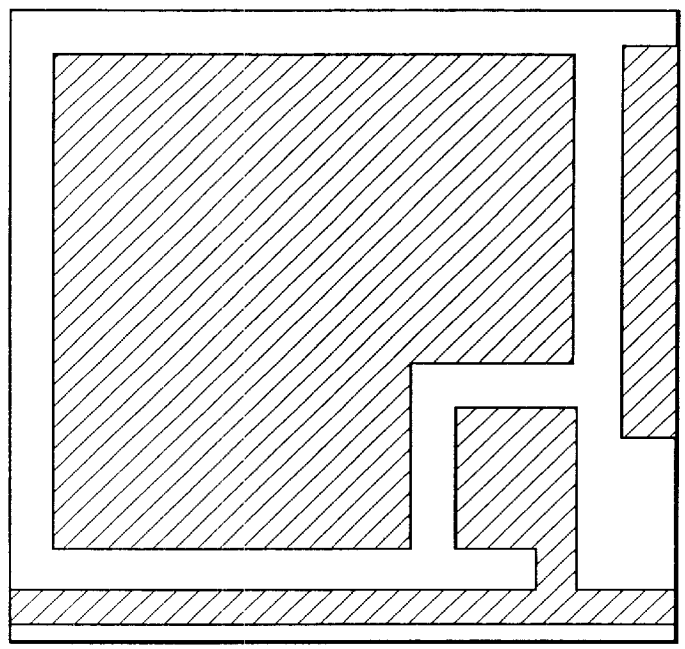

In the first step, after patterning has been conducted using a first mask as illustrated in FIG. 21, in order to prevent shorts within a pattern, patterning is again carried out with a second mask illustrated in FIG. 22, which has a pattern larger by the mask alignment margin than the pattern of the first mask. This decreases shorts within a pattern. Further, a lower electrode wire 41 is formed as a redundant wire for a signal line formed in the fourth step.

In the second step, the SiN film, i-film, and $n^+$-film are continuously formed, as in Embodiment 1.

Figure 23:
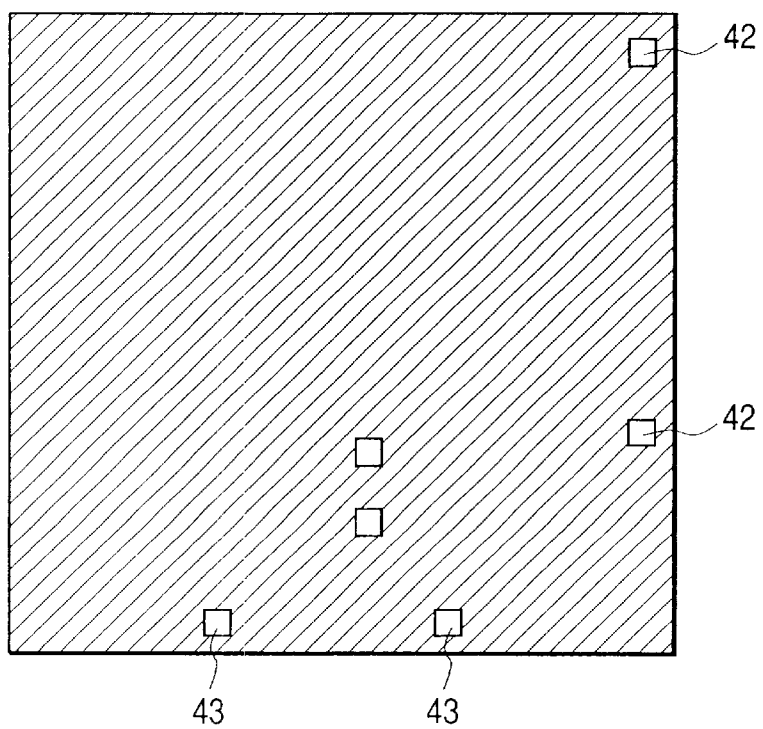

In the third step, contact holes are formed using a third mask illustrated in FIG. 23. At this time, there are formed contact holes 42 for connection to the lower electrode wire as a redundant wire for the signal line and contact holes 43 for connection to an upper electrode wire as a redundant wire for the gate wire.

Figure 24:
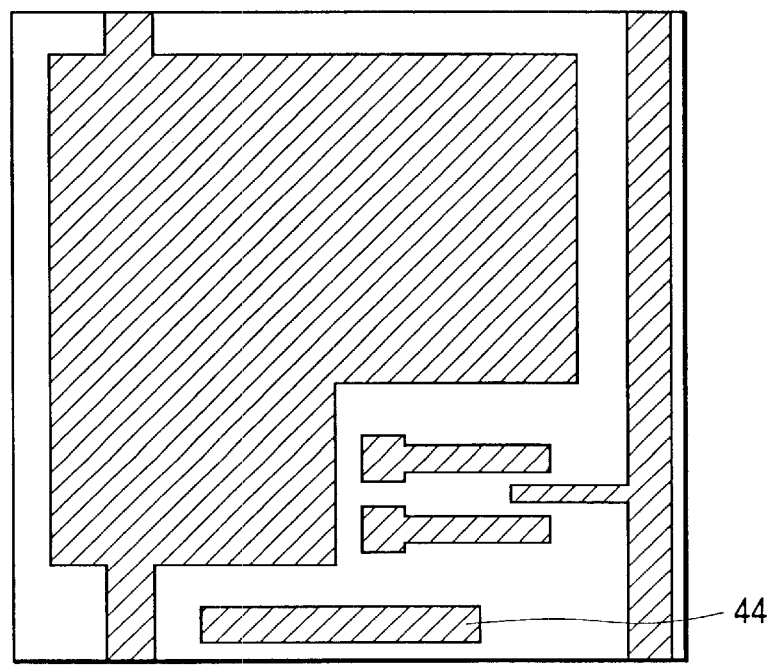

In the fourth step, patterning is conducted using a fourth mask illustrated in FIG. 24, and the source-drain electrodes of the TFT, the signal line, and the redundant wire 44 for the gate wire are formed at the same time.

Figure 25:
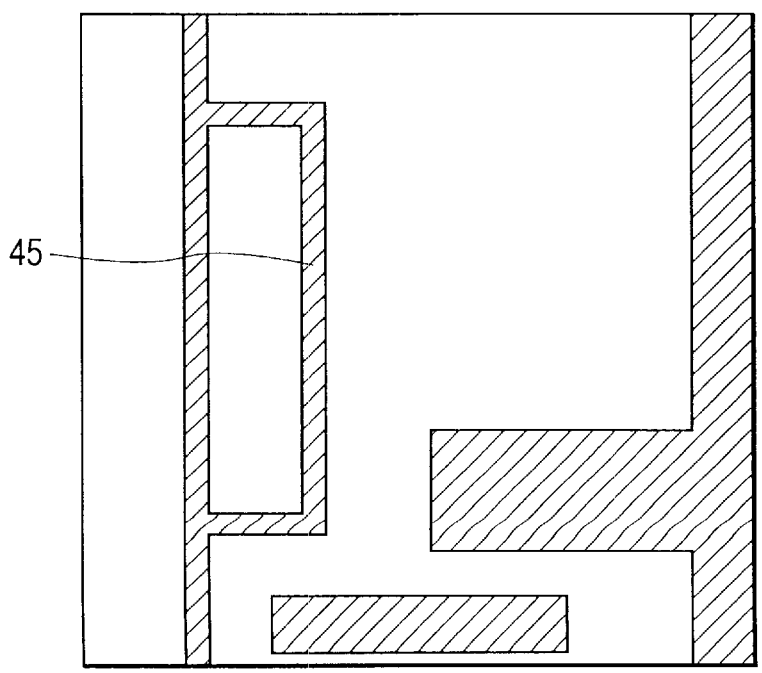

In the fifth step, patterning is conducted using a fifth mask illustrated in FIG. 25. Incidentally, the upper wire 45 of the sensor is provided with redundancy in the form of double wires.

Figure 26:
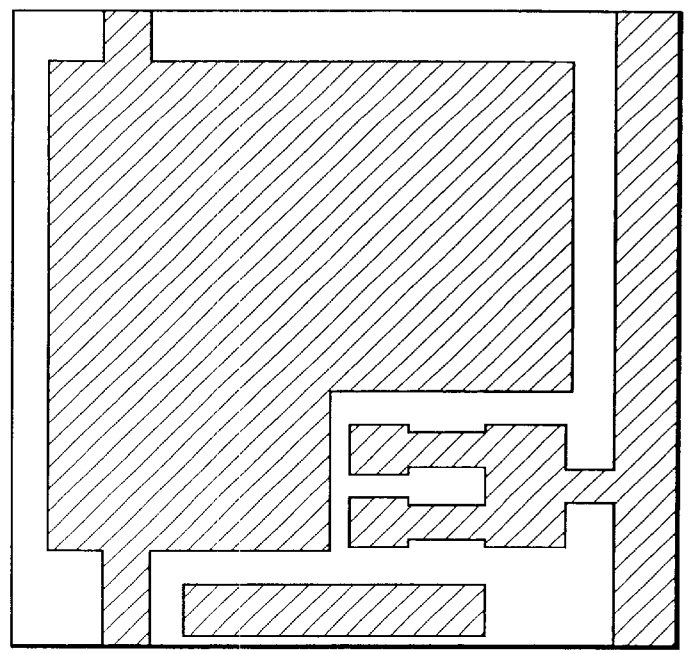

In the sixth step, after patterning has been conducted using a sixth mask illustrated in FIG. 26, in order to prevent shorts within a pattern, patterning is again carried out with a seventh mask having the same pattern as that of the sixth mask. This reduces the shorts within a pattern. The reason why the same pattern is used in this way is that the pattern of the fifth mask is originally designed in view of the alignment margin.

Figure 27:
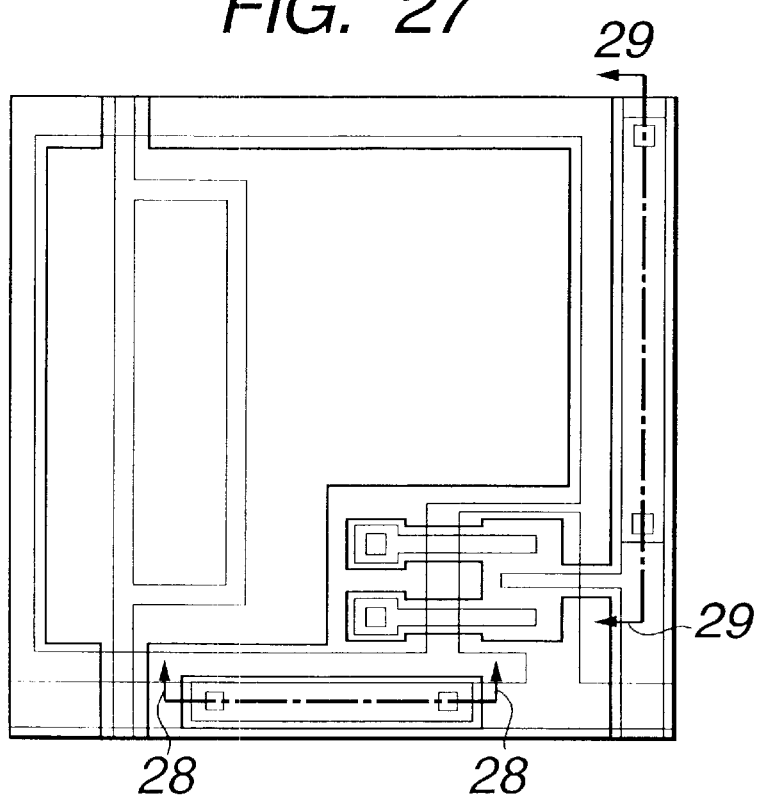
Figure 28:
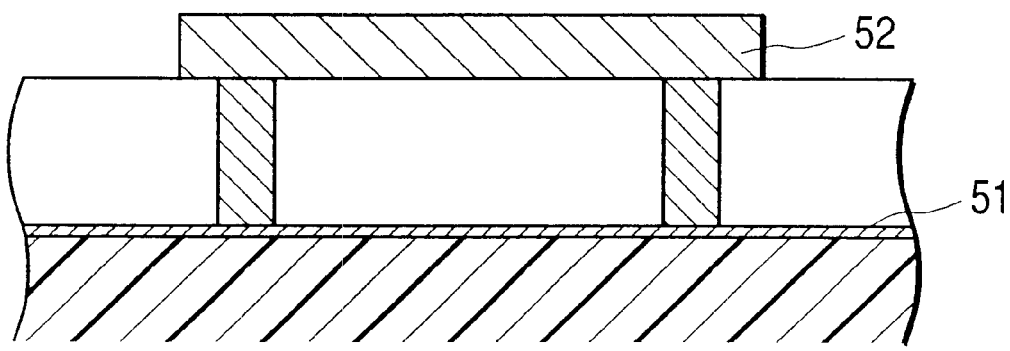
FIGS. 28 and 29 are schematic, sectional views taken along lines 28–28 and 29–29 of FIG. 27, for showing an example of a redundant wiring structure, respectively.
Figure 29:
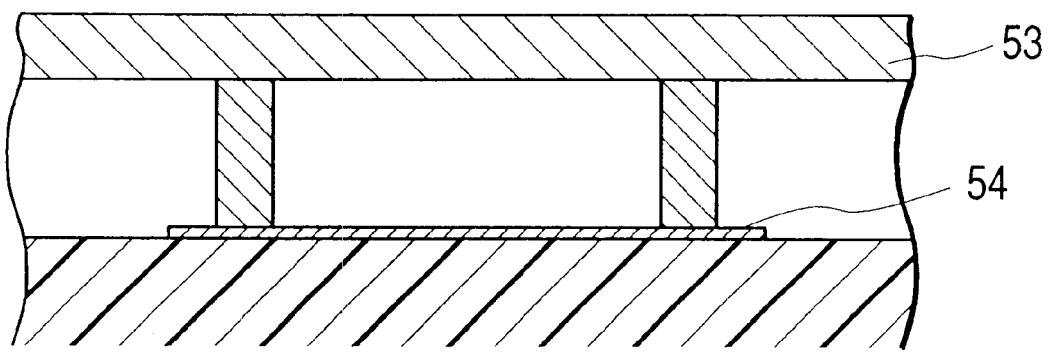

The subsequent steps are similar to those in Embodiment 1. FIG. 27 is a plan view showing one pixel. A schematic cross sectional view taken along line 28–28 in this figure is shown in FIG. 28 and a schematic cross sectional view taken along line 29–29 is also shown in FIG. 29. In FIG. 28 reference numeral 51 denotes the gate electrode and 52 the upper electrode as the redundant wire. Further, in FIG. 29 numeral 53 represents the signal line and 54 the lower electrode as the redundant wire. FIG. 27 shows only the horizontal, positional relation among the respective parts and the vertical (upper and lower) relation is not illustrated therein. Therefore, it should be noted that the respective sections are all illustrated by solid lines. (Reference should be made as to the vertical relation to FIGS. 28 and 29.)

Although this embodiment involves the two additional photolithography processes, it was actually confirmed that the yield was improved to the contrary. Since the formation of the upper electrodes is carried out separately in the fourth and the fifth steps, the same effect as above is exhibited as a countermeasure against shorts in wire, of course.

It is a matter of course that redundancy can be achieved without carrying out all of the processes as described above. Specifically, formation of either the upper or the lower electrode is sufficiently effective, and sufficient effect can also be achieved by providing redundancy only on the side that is more closely related to the cause of lowering the yield. Thus, it is desirable to determine the addition of step(s) for the increase in redundancy from the overall points of view.

As described above, the increase in redundancy enables achievement of further improvement in the yield, thereby enabling further lowering in the cost and in turn reduction of the price.

As detailed above, according to the present invention, by providing a photosensing device having a photoelectric conversion element and a switching TFT wherein the photoelectric conversion element has a first electrode layer, insulating layer, photoelectric conversion semiconductor layer, carrier injection inhibiting layer for inhibiting the carrier from being injected to the semiconductor layer, and a second electrode layer, it becomes possible to form the respective layers for constituting the photoelectric conversion element section and the TFT section by one and the same step with a simple process similar to that for the switching TFT, and it also becomes possible to implement a device with a high S/N ratio at a low cost. Further, the provision of a redundant wire can further improve the yield.

What is claimed is:

1. A photosensing device comprising:
    a pixel comprising a photoelectric conversion element and a switching TFT arranged corresponding to the photoelectric conversion element on a substrate, and
    a wire associated with the pixel,
    wherein at least a part of the wire and a redundant wire having the same function as the wire have a layered structure and are electrically connected to each other through contact holes, said at least a part of the wire and said redundant wire forming separate layers of said layered structure.

2. The photosensing device according to claim 1, wherein the photoelectric conversion element is formed using a first electrode layer, an insulating layer, a semiconductor layer, a carrier injection inhibiting layer, and a second electrode layer formed in order on a substrate, and wherein the wire is formed using the first electrode layer and the second electrode layer.

3. The photosensing device according to claim 1, wherein the switching TFT is formed using a first electrode layer, an insulating layer, a semiconductor layer, an $n^+$-layer, and a second electrode layer formed in order on a substrate, and wherein the wire is formed using the first electrode layer and the second electrode layer.

* * * * *

UNITED STATES PATENT AND TRADEMARK OFFICE
CERTIFICATE OF CORRECTION

PATENT NO. : 6,459,132 B1  Page 1 of 1
DATED : October 1, 2002
INVENTOR(S) : Chiori Mochizuki It is certified that error appears in the above-identified patent and that said Letters Patent is hereby corrected as shown below:

Title page,
Item [74], "Fitzpatrrick, Cella, Harper & Scinto" should read -- Fitzpatrick, Cella, Harper & Scinto --.

Column 5,
Line 27, "film" should read -- film 25 --.

Column 6,
Line 40, "referred-to" should read -- referred to --.

Signed and Sealed this

Third Day of June, 2003

JAMES E. ROGAN
*Director of the United States Patent and Trademark Office*